(12) United States Patent
Shingu et al.

(10) Patent No.: US 8,297,517 B2
(45) Date of Patent: Oct. 30, 2012

(54) ANTENNA CIRCUIT CONSTITUENT BODY FOR IC CARD/TAG AND IC CARD

(75) Inventors: Akira Shingu, Osaka (JP); Kiyoji Egashira, Osaka (JP)

(73) Assignee: Toyo Aluminium Kabushiki Kaisha, Osaka (JP)

( * ) Notice: Subject to any disclaimer, the term of this patent is extended or adjusted under 35 U.S.C. 154(b) by 162 days.

(21) Appl. No.: 12/988,210

(22) PCT Filed: Apr. 28, 2009

(86) PCT No.: PCT/JP2009/058315
§ 371 (c)(1),
(2), (4) Date: Oct. 15, 2010

(87) PCT Pub. No.: WO2009/136569
PCT Pub. Date: Nov. 12, 2009

(65) Prior Publication Data
US 2011/0036914 A1 Feb. 17, 2011

(30) Foreign Application Priority Data
May 9, 2008 (JP) .................................. 2008-123624

(51) Int. Cl.
*G06K 19/06* (2006.01)
*H01L 23/02* (2006.01)
(52) U.S. Cl. ........................................ 235/492; 257/679
(58) Field of Classification Search .................. 235/487, 235/492; 257/678, 679
See application file for complete search history.

(56) References Cited

U.S. PATENT DOCUMENTS

| 5,844,523 A | 12/1998 | Brennan et al. |
| 6,400,323 B2 | 6/2002 | Yasukawa et al. |
| 2008/0237356 A1* | 10/2008 | Singleton et al. ............. 235/492 |
| 2011/0042454 A1* | 2/2011 | Jones ............................ 235/375 |

FOREIGN PATENT DOCUMENTS

| JP | 2000-506329 A | 5/2000 |
| JP | 2001-16022 A | 1/2001 |
| JP | 2002-7990 A | 1/2002 |
| JP | 2003-304047 A | 10/2003 |
| JP | 2004-140587 A | 5/2004 |
| JP | 2005-100371 A | 4/2005 |
| JP | 2008-90775 A | 4/2008 |

* cited by examiner

*Primary Examiner* — Jamara Franklin
(74) *Attorney, Agent, or Firm* — Birch, Stewart, Kolasch & Birch, LLP

(57) ABSTRACT

Provided are an antenna circuit constituent body for an IC card/tag, which enhances a Q value by reducing a permittivity of a resin film of which a base material is made; and an IC card. The antenna circuit constituent body includes the base material made of resin film; and circuit pattern layers formed on each of both sides of the base material and made of aluminum foil. The circuit pattern layer includes a coiled pattern layer. Parts of the circuit pattern layers, which mutually face each other; and a part of the base material, which is interposed between the parts of the circuit pattern layers, constitute a capacitor. The circuit pattern layers are electrically connected by crimping parts. The base material includes a plurality of void-state-air layers. A relative density of the base material with respect to a density of a resin is less than or equal to 0.9.

5 Claims, 3 Drawing Sheets

ANTENNA CIRCUIT CONSTITUENT BODY FOR IC CARD/TAG AND IC CARD

TECHNICAL FIELD

The present invention relates generally to an antenna circuit constituent body for an IC card/tag and an IC card, and in particular, to an antenna circuit constituent body for an IC card/tag, which is equipped with an antenna circuit for RFID (Radio Frequency Identification) typified by a contactless IC card, an anti-shoplifting sensor, and the like, and to an IC card equipped with the antenna circuit constituent body for an IC card/tag.

BACKGROUND ART

In recent years, remarkable development of a functional card such as an IC tag and an IC card has been achieved, and the functional card has come into use in an anti-theft tag, a tag for checking those coming in and out, a telephone card, a credit card, a prepaid card, a cash card, an ID card, a card key, a variety of membership cards, a bookstore gift card, a patient registration card, a commuter pass, and the like. Each of these antenna circuit constituent bodies for the functional cards is composed of: a base material made of a resin film such as a polypropylene (PP) film and a polyethylene terephthalate (PET) film; and an antenna circuit pattern layer made of metal foil of aluminum foil or copper foil, which is formed on a surface of the base material. The metal foil is bonded on one side or both sides of the base material with an adhesive interposed therebetween by employing a dry laminate method or the like, and thereafter, the metal foil is subjected to etching processing, thereby forming the antenna circuit pattern layer on the surface of the base material.

The conventional antenna circuit constituent body having the above-mentioned configuration, the conventional functional card equipped with the above-mentioned antenna circuit constituent body, and the conventional method for manufacturing the antenna circuit constituent body are disclosed in Japanese Patent Application Laid-Open Publication No. 2004-140587 (Patent Literature 1) and Japanese Patent Application Laid-Open Publication No. 2002-7990 (Patent Literature 2).

In addition, aiming at providing an antenna sheet having an excellent design characteristic which allows projections and depressions of an IC chip and an antenna circuit not to appear on a card surface and having excellent durability which allows functions thereof not to be impaired even upon exposure to a chemical agent and a high temperature, for example, Japanese Patent Application Laid-Open Publication No. 2005-100371 (Patent Literature 3) discloses an antenna sheet composed of a plastic film, an antenna circuit, and an IC chip, in which the plastic film has a void content of 5 through 50 volume percentage and which is a fine-void containing film stretched and orientated in at least one direction. It is described therein that it is preferable that a thickness of this plastic film is 25 through 500 μm; that it is more preferable that a lower limit of the thickness is 50 μm; and it is particularly preferable that the lower limit of the thickness is 75 μm.

CITATION LIST

Patent Literature

Patent Literature 1: Japanese Patent Application Laid-Open Publication No. 2004-140587

Patent Literature 2: Japanese Patent Application Laid-Open Publication No. 2002-7990

Patent Literature 3: Japanese Patent Application Laid-Open Publication No. 2005-100371

SUMMARY OF THE INVENTION

Technical Problem

In the meantime, in the antenna circuit constituent body for an IC card/tag, circuit pattern layers are formed on both sides of the base material made of the resin film in general. In this case, on one of the surfaces of the base material, a coiled circuit pattern layer is formed. This coiled circuit pattern layer corresponds to a coil of an electronic circuit and also plays a role of an antenna receiving electromagnetic waves. In addition, the coiled circuit pattern layer, a circuit pattern layer formed on the other of the surfaces of the base material on a side opposite to the side on which the coiled circuit pattern layer is formed, and a part of the base material made of the resin film play a role of a capacitor with the resin film acting as a dielectric. Due to functioning of these coil and capacitor, a resonant circuit is formed.

As a property required of the antenna circuit constituent body for an IC card/tag, which is configured as described above, there is a Q value. The Q value is a dimensionless number representing a state of oscillation and is expressed by the following equation.

$$Q = \omega 0/(\omega 2 - \omega 1)$$

Here, $\omega 0$ is a resonance peak frequency, and $\omega 2 - \omega 1$ is a resonance peak half-width.

Because when the Q value is large, the oscillation is stabilized and a reading accuracy of the antenna circuit constituent body is improved, it is required to further enhance the Q value.

In addition, the Q value is expressed also by the following equation.

$$Q = (1/R) \times (L/C)^{0.5}$$

Here, R is an electric resistance value of a circuit, L is an inductance of the circuit, and C is a capacitance of the circuit.

Because when design specifications of the circuit pattern layers are the same, R (electric resistance value) and L (inductance) are constant, the Q value can be increased by decreasing C (capacitance).

At this time, C (capacitance) is expressed by the following equation.

$$C = \in \times (S/W)$$

Here, $\in$ is a permittivity of a dielectric interposed between electrodes facing each other, S is an area of the electrodes facing each other, and W is a distance between the electrodes facing each other.

Because when design specifications of the circuit pattern layers are the same, S (area of the electrodes facing each other) is constant, C (capacitance) can be decreased and the Q value can be increased by increasing W (distance between the electrodes facing each other) or by decreasing $\in$ (permittivity of the dielectric interposed between the electrodes facing each other).

To increase W (distance between the electrodes facing each other), it is only required to increase a thickness of the resin film constituting the base material of the antenna circuit constituent body for an IC card/tag or to configure the base material by a plurality of resin film layers. In recent years, however, a thinner antenna circuit constituent body for an IC card/tag has been demanded, and it has been required that a thickness of the resin film constituting the base material is less than or equal to 50 μm.

Furthermore, to cause the above-mentioned parts to function as the capacitor, it is essential for the circuit pattern layers on the both sides to be joined so as to allow electrical continuity. As a comparatively general and inexpensive method for joining the circuit pattern layers on the both sides, there is a method in which a resin film layer is broken through in a physical or thermal manner and the circuit pattern layers on the both sides are directly joined through caulking or welding. In such a case, if a thickness of the resin film exceeds 50 μm, it is likely that joining the circuit pattern layers on the both sides is made difficult.

Consequently, to reduce a permittivity of the resin film constituting the base material, it is only required to adopt a film made of a resin whose permittivity is low. However, any of resins each having low permittivity, such as an olefin-based resin, is inferior in heat resistance. Therefore, incurred is a problem that the above-mentioned resins cannot withstand thermal processing subjected in manufacturing processes of working of a resin into a base material included in an antenna circuit constituent body for an IC card/tag; mounting of a semiconductor chip on a surface of the base material; forming of a card; and the like. For this reason, polyethylene terephthalate or polyethylene naphthalate, which has heat resistance, is used in general as a material of a resin film of which the base material is made.

Therefore, objects of the present invention are to provide an antenna circuit constituent body for an IC card/tag, which is capable of enhancing a Q value by reducing a permittivity of a resin film of which a base material is made; and an IC card equipped with the antenna circuit constituent body for an IC card/tag.

Solution to Problem

In order to reduce the permittivity of the resin film of which the base material is made, the present inventors have carried out a variety of investigations, and as a result, obtained the following findings.

First, a substance whose permittivity is the lowest is a vacuum, and a substance close to the vacuum is air. In reality, however, it is impossible to interpose the air between parts of the circuit pattern layers, which correspond to electrodes of a capacitor, instead of the base material made of the resin film. On the other hand, through configuring the base material by providing two layers of the resin film therein, it is made possible to provide an air layer between the two layers of the resin film. In this case, shape stability of the base material cannot be secured. Thus, it has been found out that through causing air, whose permittivity is low, in the form of voids to be present inside the resin film, that is, through causing the resin film to contain a plurality of void-state-air layers, a permittivity of the whole resin film can be reduced as compared with a resin film not containing such voids, and shape and thermal stability of the base material can be secured.

From another viewpoint, it is also considered that a liquid whose permittivity is low is caused to be present inside the resin film. In this case, however, it is likely that the liquid externally leaks, and therefore, this way is not preferable.

On the basis of the above-described findings, the present inventors have found out that through configuring the antenna circuit constituent body for an IC card/tag as described below, the permittivity of the resin film of which the base material is made can be reduced, and even when a resin film whose thickness is less than or equal to 50 μm is adopted as the base material, a higher Q value than that of the conventional product can be realized.

An antenna circuit constituent body for an IC card/tag, according to the present invention, comprises: a base material made of a resin film; a first circuit pattern layer formed on one of surfaces of the base material and made of an electrically conductive body including metal as a main component; and a second circuit pattern layer formed on the other of the surfaces of the base material and made of an electrically conductive body including metal as a main component. At least either of the first circuit pattern layer and the second circuit pattern layer includes a coiled pattern layer. A part of the first circuit pattern layer; a part of the second circuit pattern layer, the part thereof facing the part of the first circuit pattern layer with the base material interposed; and a part of the base material, the part thereof interposed between the parts of the first circuit pattern layer and the second circuit pattern layer constitute a capacitor. The first circuit pattern layer and the second circuit pattern layer are electrically connected so as to allow electrical continuity therebetween. The base material includes a plurality of void-state-air layers. A relative density of the base material with respect to a density of the resin is less than or equal to 0.9. An average volume of the void-state-air layers is greater than or equal to 2 μm³ and less than or equal to 90 μm³.

In the antenna circuit constituent body for an IC card/tag, according to the present invention, it is preferable that the resin film is made of polyethylene terephthalate.

In addition, in the antenna circuit constituent body for an IC card/tag, according to the present invention, it is preferable that the resin film is a biaxially-drawn film.

Furthermore, in the antenna circuit constituent body for an IC card/tag, according to the present invention, it is preferable that the first circuit pattern layer and the second circuit pattern layer are made of aluminum foil.

Moreover, in the antenna circuit constituent body for an IC card/tag, according to the present invention, it is preferable that each of the first circuit pattern layer and the second circuit pattern layer and the base material are thermally bonded with each adhesive layer interposed therebetween, respectively.

An IC card according to the present invention comprises: the antenna circuit constituent body for an IC card/tag, which has the above-mentioned features; and cover materials each bonded through thermal compression on each of both sides of the antenna circuit constituent body for an IC card/tag with said each adhesive layer interposed therebetween, respectively.

In the IC card according to the present invention, it is preferable that a peel strength between the antenna circuit constituent body for an IC card/tag and the cover materials is greater than or equal to 6 N/10 mm.

Advantageous Effects of the Invention

As described above, according to the present invention, in an antenna circuit constituent body for an IC card/tag, a permittivity of a resin film of which a base material is made can be reduced, and a higher Q value can be realized.

DESCRIPTION OF EMBODIMENTS

Hereinafter, an embodiment of the present invention will be described with reference to the accompanying drawings.

First, as the one embodiment of the present invention, an antenna circuit constituent body for an IC card/tag will be described.

Figure 1:
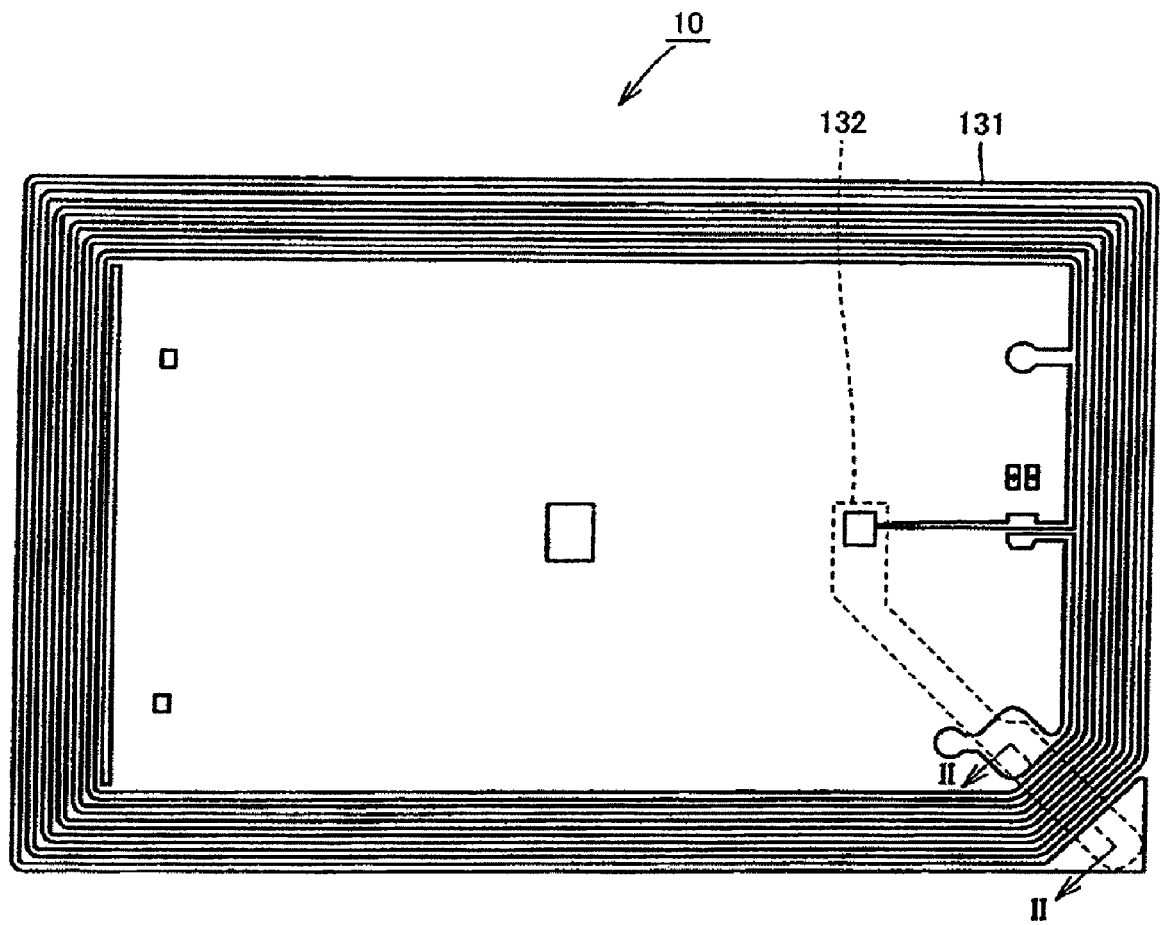
FIG. 1 is a plan view of an antenna circuit constituent body for an IC card/tag, according to one embodiment of the present invention.
Figure 2:
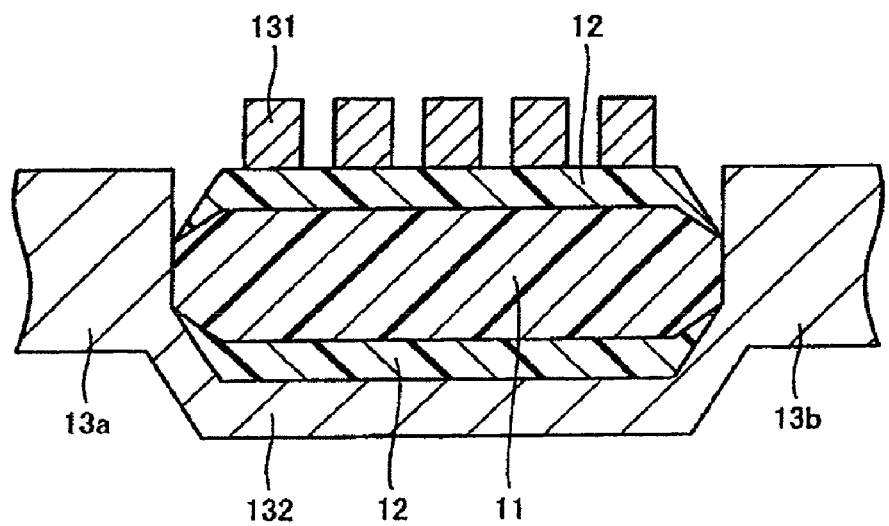
FIG. 2 is a partially enlarged cross-sectional view taken from a direction of a line II-II of FIG. 1.

As shown in FIG. 1 and FIG. 2, an antenna circuit constituent body 10 for an IC card/tag as one example of the antenna circuit constituent body for an IC card/tag is composed of: a base material 11 made of a resin film; adhesive layers 12 each formed on each of both sides of the base material 11; and circuit pattern layers 131 and 132, each of which is formed on a surface of each of the adhesive layers 12 in accordance with each predetermined pattern and made of aluminum foil containing aluminum as one example of a main component. As indicated by a solid line in FIG. 1, the circuit pattern layer 131 as one example of a first circuit pattern layer formed on one of surfaces of the base material 11 is formed in a spiral or coiled pattern on a front side of the base material 11. As indicated by a dotted line in FIG. 1, the circuit pattern layer 132 as one example of a second circuit pattern layer formed on the other of the surfaces of the base material 11 is arranged on a back side of the base material 11. The circuit pattern layer 131 formed on the front side of the base material 11 is in contact with the circuit pattern layer 132 formed on the back side of the base material 11 so as to be electrically continuous with each other by means of crimping parts 13a and 13b. For example, through conducting a crimping process using ultrasonic waves or the like, parts of the circuit pattern layers 131 and 132, each of which is formed on each of the both sides of the base material 11 with each of the adhesive layers 12 interposed, respectively are mutually pressed against each other; thereby, the adhesive layers 12 and the resin of which the base material 11 is made are partially destroyed; and thereby, the parts of the circuit pattern layers 131 and 132 on the both sides are rendered physically in contact with each other, thus achieving the above-mentioned contacting.

As shown in FIG. 2, a part (coiled part) of the circuit pattern layer 131; a part of the circuit pattern layer 132, which faces the part of the circuit pattern layer 131 with the base material 11 interposed; and a part of the base material 11, which is interposed between the part of the circuit pattern layer 131 and the part of the circuit pattern layer 132 constitute a capacitor.

The base material 11 contains a plurality of void-state-air layers. The void-state-air layers are present inside the base material 11 with a predetermined content so as to attain 0.9 or less of a relative density of the base material 11 containing the plurality of void-state-air layers with respect to an inherent density of the resin of which the base material 11 is made. If the above-mentioned relative density exceeds 0.9, a permittivity of the base material 11 cannot be sufficiently reduced. Although a lower limit of the above-mentioned relative density is not particularly limited, the lower limit thereof is approximately 0.5.

An average volume of the void-state-air layers is greater than or equal to 2 $\mu m^3$ and less than or equal to 90 $\mu m^3$, and it is preferable that the average volume thereof is greater than or equal to 3 $\mu m^3$ and less than or equal to 20 $\mu m^3$. If the average volume of the void-state-air layers is less than 2 $\mu m^3$, it is likely that due to thermal processing subjected in or mechanical forces exerted in manufacturing processes of: working of the resin into the base material included in the antenna circuit constituent body for an IC card/tag; mounting of a semiconductor chip on a surface of the base material; forming of a card; and the like, the void-state-air layers are destroyed. If the average volume of the void-state-air layers exceeds 90 $\mu m^3$, it is likely to cause variations and instability in a Q value.

Although a method for causing the resin film to contain the void-state-air layers is not particularly limited, it is preferable to adopt a method in which a thermoplastic resin is caused to contain fine powder of an inorganic substance or an organic substance and is drawn at a temperature less than or equal to a melting point of the thermoplastic resin. In addition, from a viewpoint of dimensional stability of the base material 11, it is more preferable to adopt a biaxially-drawn film as the resin film. By adopting the biaxially-drawn film, since each of the void-state-air layers can be present inside the resin film in a disc-like form which is thin in a thickness direction, a Q value of the antenna circuit constituent body for an IC card/tag can be more effectively enhanced.

Although a material of the resin film of which the base material 11 is made is not particularly limited and it is only required for the material to have heat resistance, polyethylene terephthalate, polyethylene naphthalate, polycarbonate, polyimide, or the like is preferably used. In particular, in terms of general versatility, polyethylene terephthalate (PET) is preferably used.

It is preferable that a thickness of the resin film is greater than or equal to 5 $\mu m$ and less than or equal to 50 $\mu m$, and it is more preferable that the thickness thereof is greater than or equal to 25 $\mu m$ and less than or equal to 38 $\mu m$. If the thickness of the resin film is less than 5 $\mu m$, it is made difficult to maintain a shape of the base material 11. If the thickness of the resin film exceeds 50 $\mu m$, it is made difficult to join the circuit pattern layers 131 and 132, each of which is formed on each of the both sides of the base material 11, by conducting the crimping process or the like.

For adhesion between the aluminum foil which is used for forming the circuit pattern layers 131 and 132 and the resin film of which the base material 11 is made, it is preferable to employ a dry-amination process utilizing a polyurethane (PU)-based adhesive containing an epoxy resin. As the polyurethane-based adhesive containing the epoxy resin, AD506, AD503, or AD76-P1 manufactured by Toyo-Morton Ltd., or the like can be adopted. As a hardening agent, CAT-10 manufactured by Toyo-Morton Ltd. can be adopted, and it is only required to use a mixture of the adhesive and the hardening agent with a mixing ratio of the adhesive:the hardening agent being 2 through 12:1. In a case where a general polyurethane-based adhesive not containing the epoxy resin is used, while etching processing for forming the circuit pattern layers is being conducted and when mounting of an IC chip is being conducted, delamination (peeling) may easily occur. This is because the polyurethane-based adhesive not containing the epoxy resin is inferior in chemical resistance and heat resistance.

Next, one embodiment of an IC card according to the present invention will be described.

Figure 3:
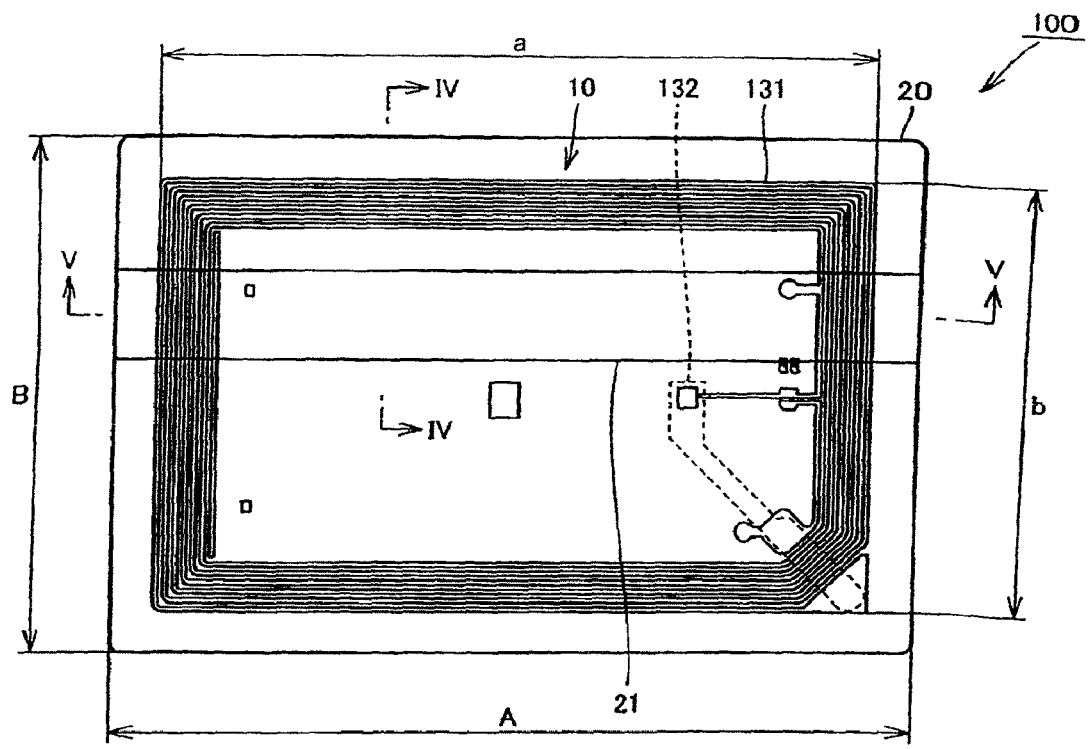
FIG. 3 is a plan view illustrating in a perspective manner an IC card, shown in FIG. 1, equipped with the antenna circuit constituent body for an IC card/tag.
Figure 4:
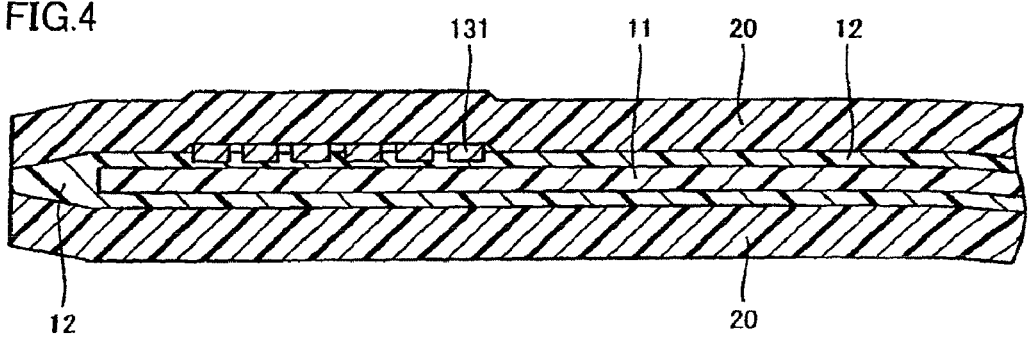
FIG. 4 is a partially enlarged cross-sectional view taken from a direction of a line IV-IV of FIG. 3.

As shown in FIG. 3 and FIG. 4, an IC card 100 as one example of the IC card includes: the antenna circuit constituent body 10 for an IC card/tag, which has the above-described features; and cover materials 20, each of which is bonded through thermal compression on each of the both sides of the antenna circuit constituent body 10 for an IC card/tag with each of the adhesive layers 12 interposed, respectively. Each of the two cover materials 20 is arranged on each of the both sides of the antenna circuit constituent body 10 for an IC card/tag and bonded through thermal compression so as to surround and cover an outer peripheral portion of the antenna circuit constituent body 10 for an IC card/tag. In a case where by utilizing as described above the adhesive layers 12 which are used for causing the aluminum foil for forming the circuit pattern layers 131 and 132 and the resin film as the base material 11 to adhere to each other, each of the two cover materials 20 is laminated on each of the both sides of the antenna circuit constituent body 10 for an IC card/tag, it is preferable that the adhesive layers 12 are adhesive layers formed by employing a heat lamination process using a polyester-based adhesive. In other words, in the antenna circuit constituent body 10 for an IC card/tag, it is preferable that each of the circuit pattern layers 131 and 132 and the base material 11 are bonded through thermal adhesion with each of the adhesive layers 12 interposed, respectively. Since these adhesive layers 12 remain on the base material 11 even after the etching processing for forming the circuit pattern layers 131 and 132, these adhesive layers 12 can be reused as the adhesive layers when the two cover materials 20 are laminated and bonded through thermal compression on the both sides of the antenna circuit constituent body 10 for an IC card/tag. In this case, in the IC card 100, it is preferable that a peel strength between the antenna circuit constituent body 10 for an IC card/tag and the cover materials 20 is greater than or equal to 6 N/10 mm.

A material of the cover materials 20 is not particularly limited, it is only required for the material to have no electrical conductivity and to allow being bonded through thermal compression, and paper, resin, glass (fibers) or the like is favorably used, depending on an application and a user's preference of a texture.

As a material of the paper, for example, a white paperboard, a clay coated newsback board, synthetic paper, or the like can be used. In addition, in accordance with the intended use, a material obtained by laminating a resin film on a paperboard, a paperboard with a resin coated, or the like can also be used.

As a material of the resin, for example, a polyethylene-based resin film, a polypropylene-based resin film, a polystyrene-based resin film, a vinyl-chloride-based resin film, a polyimide-based resin film, a polyether-ketone-based resin film, an acrylonitrile-styrene-based resin film, a polycarbonate-based resin film, a laminated body of each of the above-mentioned resin films, or the like can be used. In particular, vinyl chloride, polyethylene terephthalate, or polycarbonate is favorably used.

Although a thickness of each of the two cover materials 20 may be appropriately set depending on an application, the thickness of each of the two cover materials 20 is approximately 0.1 through 0.4 mm in general. In addition, it is not required to make the materials and the thicknesses of the two cover materials 20 the same as each other.

In a case where the adhesive used for the adhesion between the aluminum foil which is used for forming the circuit pattern layers 131 and 132 and the resin film of which the base material 11 is made is not reused as the adhesive layers when the cover materials 20 are laminated and bonded through the thermal compression, it is only required to appropriately arrange an adhesive or the like for the thermal compression bonding between each of the both sides of the antenna circuit constituent body 10 for an IC card/tag and each of the two cover materials 20, respectively and to conduct the thermal compression bonding. In this case, the adhesion between the aluminum foil which is used for forming the circuit pattern layers 131 and 132 and the resin film of which the base material 11 is made may be conducted by employing either of the dry lamination process or the heat lamination process.

Next, one embodiment of a method, according to the present invention, for manufacturing the antenna circuit constituent body for an IC card/tag will be described briefly.

First, each of the adhesive layers 12 is formed on each of the both sides of the base material 11 made of the resin film, and the aluminum foil is firmly fixed on each of the both sides of the base material 11 by means of each of the adhesive layers 12. In this way, a laminated body of the aluminum foil and the base material 11 is prepared.

Next, a resist ink layer is printed on a surface of the aluminum foil so as to have a predetermined spiral pattern in accordance with specifications of an antenna coil. After the printing, curing processing of the resist ink layer is conducted.

The aluminum foil is subjected to etching with the resist ink layer used as a mask, thereby forming the circuit pattern layers 131 and 132.

Thereafter, the resist ink layer is peeled. Finally, predetermined regions of the circuit pattern layers 131 and 132 are subjected to the crimping process or the like, thereby forming contacting portions or the crimping parts 13a and 13b in parts of the circuit pattern layers 131 and 132 as shown in FIG. 2. As described above, the antenna circuit constituent body 10 for an IC card/tag according to the present invention is completed.

Although the resist ink used in the manufacturing method according to the present invention is not particularly limited, it is preferable to use ultraviolet cure resist ink whose main components are an acrylic monomer having at least one carboxyl group in a molecule and an alkali-soluble resin. Since this resist ink allows gravure printing to be conducted, has acid resistance, and can be easily peeled and removed by an alkali, this resist ink is suited to continuous mass production. By using this resist ink, the aluminum foil is subjected to the gravure printing with a predetermined circuit pattern, is cured by being irradiated with ultraviolet rays, and is subjected to acid etching of the aluminum foil in accordance with an ordinary method by using, for example, a ferric chloride or the like and to peeling and removal of the resist ink layer by using an alkali such as an sodium hydroxide, thereby allowing the circuit pattern layers to be formed.

As the acrylic monomer having at least one carboxyl group in a molecule, for example, 2-acryloyloxyethyl phthalic acid, 2-acryloyloxyethyl succinic acid, 2-acryloyloxyethyl hexahydrophthalic acid, 2-acryloyloxypropyl phthalic acid, 2-acryloyloxypropyl tetrahydro phthalic acid, 2-acryloyloxypropyl hexahydrophthalic acid, or the like is cited, and each of these acrylic monomers may be used alone or two or more of these acrylic monomers may be mixed to be used. As the above-mentioned alkali-soluble resin, for example, a styrene-maleic acid resin, a styrene-acrylic resin, a rosin-maleic acid, or the like is cited.

Beside the above-mentioned components, an ordinary monofunctional acrylic monomer, an ordinary polyfunctional acrylic monomer, and an ordinary prepolymer can be added to the resist ink to the extent that alkali peeling properties are not inhibited, and a photo polymerization initiator, a pigment, an additive agent, a solvent, and the like can be appropriately added thereto, thereby allowing the resist ink to be prepared. As the photo polymerization initiator, benzophenone, a derivative of the benzophenone, benzil, benzoin, alkyl ether of the benzil, alkyl ether of the benzoin, thioxanthone, a derivative of the thioxanthone, Lucirin PTO, IRGACURE manufactured by Ciba Specialty Chemicals Corporation, Esacure manufactured by Fratteli-Lamberti SpA, or the like is cited. As the pigment, a coloring pigment is added to allow the pattern to be easily viewable, and in addition, an extender such as silica, talc, clay, barium sulfate, and calcium carbonate can be used in combination. In particular, the silica is effective for prevention of blocking in a case where copper foil is to be rolled up with the ultraviolet cure resist ink remaining thereon. As the additive, there are a polymerization inhibitor such as 2-tertiary butyl hydroquinone, silicon, a fluorine compound, an antifoaming agent such as an acrylic-polymeric substance, and a leveling agent, which may be appropriately added as needed. As the solvent, ethyl acetate, ethanol, denatured alcohol, isopropyl alcohol, toluene, MEK, or the like is cited, and each of these solvents may be used alone or two or more of these solvents may be mixed to be used. It is preferable that after the gravure printing, the solvent is evaporated from the resist ink layer through hot air drying or the like.

EXAMPLES

Hereinafter, examples 1 through 8 of the present invention and a comparative example will be described.

Example 1

As a material of the base material 11, a biaxially-drawn film of polyethylene terephthalate (PET) was prepared such that a relative density of the base material 11 containing a plurality of void-state-air layers with respect to an inherent density of a resin of which the base material 11 was made was 0.8, an average volume of the void-state-air layers was 4.5 $\mu m^3$, and a thickness of the biaxially-drawn film was 38 μm.

The average volume of the void-state-air layers was measured in the following manner. First, a cross section of the resin film was observed by using a scanning electron microscope at a magnification of 2000 times, and photographs of two fields of view were shot. In each of the photographs, thicknesses and widths of any 50 pieces of void-state-air layers were measured, volumes thereof were calculated, assuming that a shape of each of the void-state-air layers was disc-like, and an average value of the volumes was determined to be the average volume of the void-state-air layers.

On both sides of the base material 11, rolled aluminum foil having a thickness of 30 μm was bonded through employing a dry lamination method by using AD76-P1 manufactured by Toyo-Morton Ltd. as a polyurethane-based adhesive containing an epoxy resin, thereby preparing a laminated body. An application amount of the adhesive was 3.5 $g/m^2$. On both sides of the laminated body obtained as described above, printing patterns for forming the circuit pattern layers 131 and 132 as shown in FIG. 1 were printed by using a resist ink having the below-shown composition and a Helio-Klischo-gravure printing plate. After the printing, irradiation was conducted for 15 seconds by using an ultraviolet ray lamp with an exposure dose of 480 $W/cm^2$, and thereby, the resist ink was cured, thus forming resist ink layers.

The composition of the ink was as follows.

Beckacite J-896 (a rosin-maleic acid resin manufactured by DIC Corporation): 21 parts by weight 2-acryloyl hexyethylhexa hydrophtalic acid: 25 parts by weigh Unidic V-5510 (a mixture of a prepolymer and a monomer, manufactured by DIC Corporation): 8 parts by weight IRGACURE 184: 3 parts by weight Ethyl acetate: 28 parts by weight Denatured alcohol: 12 parts by weight Phthalocyanine blue: 1 part by weight Silica: 2 parts by weight By immersing the laminated body having the resist ink layers formed thereon as described above in a ferric chloride aqueous solution of 42° Baume for 5 minutes at a temperature of 45° C., etching of the aluminum foil was conducted, thereby forming the circuit pattern layers 131 and 132 in accordance with predetermined patterns. Thereafter, by immersing the laminated body in a 1% a sodium hydroxide aqueous solution for 10 seconds at a temperature of 20° C., the resist ink layer was peeled. The laminated body was dried by warm air having a temperature of 70° C.

At predetermined positions of the laminated body obtained as described above, or specifically, on the crimping parts 13a and 13b shown in FIG. 2, a crimping process was conducted. By conducting the crimping process, parts of the circuit pattern layers 131 and 132, each of which was formed on each of the both sides of the base material 11 with each of the adhesive layers 12 interposed, respectively were mutually pressed against each other; thereby, the adhesive layers 12 and the resin of which the base material 11 was made were partially destroyed; and thereby, the parts of the circuit pattern layers 131 and 132 on the both sides were rendered physically in contact with each other, thus achieving electrical continuity. As described above, the antenna circuit constituent body 10 for an IC card/tag, according to the present invention, which used the aluminum foil having shapes shown in FIG. 1 and FIG. 2 was prepared.

By using a spectrum analyzer (manufactured by Advantest Corporation, product No. U3751), a Q value of the antenna circuit constituent body 10 for an IC card/tag was measured at a point of −3 dB from a resonance point. The obtained Q value was 106 as a relative value obtained when a Q value resulting when the same PET film (the above-mentioned relative density was 1.0) having the thickness of 38 μm but including no void-state-air layers was used was defined as 100.

Embodiment 2

Except that as a material of the base material 11, a biaxially-drawn film of polyethylene terephthalate (PET) prepared such that a relative density of the base material 11 containing a plurality of void-state-air layers with respect to an inherent density of a resin of which the base material 11 was made was 0.8, an average volume of the void-state-air layers was 4.5 $\mu m^3$, and a thickness of the biaxially-drawn film was 25 μm was used, an antenna circuit constituent body 10 for an IC card/tag was prepared in the same manner as in Embodiment 1. A Q value of the obtained antenna circuit constituent body 10 for an IC card/tag was measured in the same manner as in Embodiment 1. The obtained Q value was 107 as a relative value obtained when a Q value resulting when the same PET film (the above-mentioned relative density was 1.0) having the thickness of 25 μm but including no void-state-air layers was used was defined as 100.

Embodiment 3

Except that as a material of the base material 11, a biaxially-drawn film of polyethylene terephthalate (PET) prepared such that a relative density of the base material 11 containing a plurality of void-state-air layers with respect to an inherent density of a resin of which the base material 11 was made was 0.6, an average volume of the void-state-air layers was 18.5 µm³, and a thickness of the biaxially-drawn film was 38 µm was used, an antenna circuit constituent body 10 for an IC card/tag was prepared in the same manner as in Embodiment 1. A Q value of the obtained antenna circuit constituent body 10 for an IC card/tag was measured in the same manner as in Embodiment 1. The obtained Q value was 110 as a relative value obtained when a Q value resulting when the same PET film (the above-mentioned relative density was 1.0) having the thickness of 38 µm but including no void-state-air layers was used was defined as 100.

Embodiment 4

Except that for the adhesion between each of the both sides of the base material 11 and the aluminum foil, each polyester-based adhesive layer was previously formed on each of the both sides of the base material 11, respectively and thereafter, the aluminum foil was bonded on each of the both sides of the base material 11 by employing a heat lamination method, an antenna circuit constituent body 10 for an IC card/tag was prepared in the same manner as in Embodiment 1.

Specifically, in a case where a polyester-based adhesive was used instead of the polyurethane-based adhesive containing the epoxy resin, each of the adhesive layers was previously formed on each of the both sides of the base material 11 through conducting coextrusion upon manufacturing the base material 11, respectively and thereafter, rolled aluminum foil having a thickness of 30 µm was bonded on each of the both sides of the base material 11 by employing a heat lamination method, thereby preparing a laminated body. An application amount of the adhesive was 1.0 g/m².

A Q value of the obtained antenna circuit constituent body 10 for an IC card/tag was measured in the same manner as in Embodiment 1. The obtained Q value was 106 as a relative value obtained when a Q value resulting when the same PET film (the above-mentioned relative density was 1.0) having the thickness of 25 µm but including no void-state-air layers was used was defined as 100.

Comparative Example

Except that as a material of the base material 11, a biaxially-drawn film of polyethylene terephthalate (PET) prepared such that a relative density of the base material 11 containing a plurality of void-state-air layers with respect to an inherent density of a resin of which the base material 11 was made was 0.8, an average volume of the void-state-air layers was 1.0 µm³, and a thickness of the biaxially-drawn film was 38 µm was used, an antenna circuit constituent body 10 for an IC card/tag was prepared in the same manner as in Embodiment 1. A Q value of the obtained antenna circuit constituent body 10 for an IC card/tag was measured in the same manner as in Embodiment 1. The obtained Q value was 101 as a relative value obtained when a Q value resulting when the same PET film (the above-mentioned relative density was 1.0) having the thickness of 38 µm but including no void-state-air layers was used was defined as 100.

As can be seen from the above-mentioned result, it was confirmed that a higher Q value than that of the conventional product was realized even when the base material having the thickness less than or equal to 50 µm was used in the antenna circuit constituent body 10 for an IC card/tag, according to the present invention, in which the biaxially-drawn film of the polyethylene terephthalate (PET) having the relative density less than or equal to 0.9 and the average volume of the void-state-air layers greater than or equal to 2 µm³ and less than or equal to 90 µm³ was used as the base material 11.

Examples 5 Through 8

In the antenna circuit constituent body 10 for an IC card/tag obtained in Example 4, an IC chip or the like was bonded at a predetermined position, and as shown in FIG. 3 and FIG. 4, on each of the both sides of the antenna circuit constituent body 10 for an IC card/tag, each of the two cover materials 20 of a material shown in Table 1 was laminated and bonded through conducting thermal compression. As described above, an IC card 100 was prepared. Thermal compression conditions were: that a temperature was 140° C.; that a pressure was 40 N/cm²; and that duration was 20 minutes. Note that in FIG. 3, a dimension a was 76 mm; a dimension b was 46 mm; a dimension A was 85 mm; and a dimension B was 54 mm.

Figure 5A:
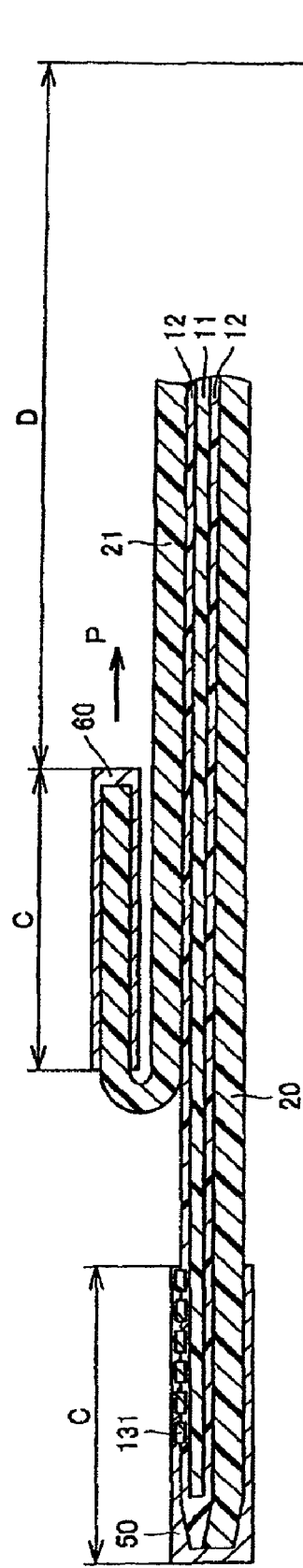
FIG. 5 is a partially enlarged cross-sectional view illustrating a partially enlarged cross-section taken from a direction of a line V-V of FIG. 3 and showing a method of measuring a peel strength by peeling a part of a cover material.
Figure 5B:
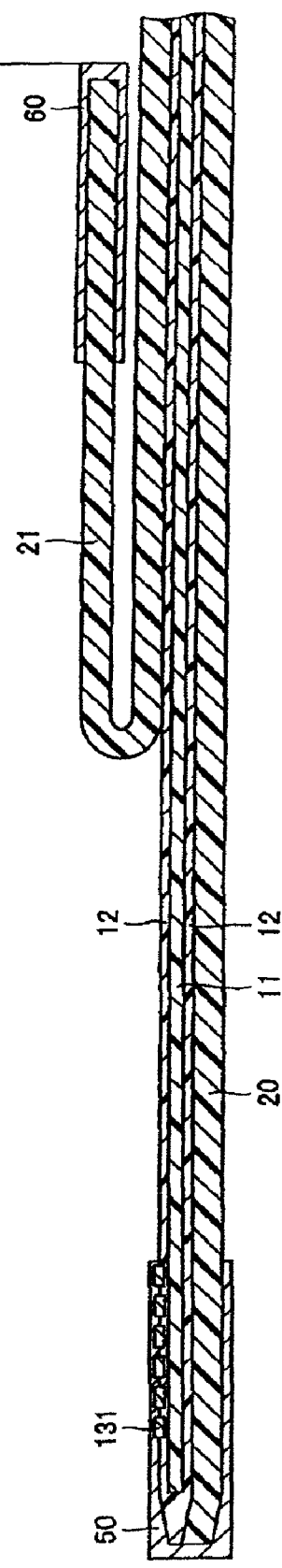

A peel strength [N/10 mm] between the antenna circuit constituent body 10 for an IC card/tag and the cover materials 20 in the obtained IC card 100 was measured. Specifically, a cover material portion 21 (a width of 10 mm and a length of 85 mm) which was a part of the cover material 20 shown in FIG. 3 was cut and first peeled in a direction indicated by an arrow P as shown in FIG. 5A. In a state where portions C (a length of approximately 20 mm) of both ends shown in FIG. 5A were caught by chucks 50 and 60, a 180° peel test was conducted by pulling, in the direction indicated by the arrow P, the cover material portion 21 at a straining rate of 300 mm/minute in the same normal direction by using a tensile testing machine until a dimension D shown in FIG. 5B reached 50 mm, thereby measuring the peel strength. The result is shown in Table 1.

TABLE 1

| Cover material | | | Peel |
|---|---|---|---|
| Material | Product name/ Model No. | Thickness [mm] (Unit weight [g/mm²]) | strength [N/10 mm] |
| Paper | White coat cardboard | (300) | 6.47 |
| Vinyl chloride | Manufactured by Mitsubishi Plastics, Inc. C4636 | 0.15 | 6.67 |
| Polyethylene terephthalate | Manufactured by Taihei Chemicals Limited PG700M | 0.20 | 6.43 |
| Polycarbonate | Manufactured by Asahi Glass Co., Ltd. HEKISAN | 0.18 | 6.27 |

It is seen from Table 1 that even when the cover materials made of any of the materials are used, a peel strength which allows the cover materials to sufficiently withstand the use in an IC card is obtained. In addition, judging from the result that the favorable peel strength can be obtained under the same compression conditions, it is seen that respective materials of the cover materials arranged on the both sides of an IC card may be different from each other.

The described embodiment and examples are to be considered in all respects only as illustrative and not restrictive. It is intended that the scope of the invention is, therefore, indicated by the appended claims rather than the foregoing description of the embodiment and examples and that all modifications and variations coming within the meaning and equivalency range of the appended claims are embraced within their scope.

INDUSTRIAL APPLICABILITY

According to the present invention, in an antenna circuit constituent body for an IC card/tag, a permittivity of a resin film of which a base material is made can be reduced and a higher Q value can be realized, and an IC card equipped with the antenna circuit constituent body for an IC card/tag can be obtained.

REFERENCE SIGNS LIST

10: antenna circuit constituent body for an IC card/tag, 11: base material, 12: adhesive layer, 13a, 13b: crimping part, 20: cover material, 100: IC card, 131, 132: circuit pattern layer.

The invention claimed is:

1. An antenna circuit constituent body for an IC card/tag, comprising:
    a base material made of a resin film;
    a first circuit pattern layer formed on one of surfaces of the base material and made of an electrically conductive body including metal as a main component; and
    a second circuit pattern layer formed on the other of the surfaces of the base material and made of an electrically conductive body including metal as a main component, wherein
    at least either of the first circuit pattern layer and the second circuit pattern layer includes a coiled pattern layer,
    a part of the first circuit pattern layer; a part of the second circuit pattern layer, the part of the second circuit pattern layer facing the part of the first circuit pattern layer with the base material interposed; and a part of the base material, the part of the base material interposed between the parts of the first circuit pattern layer and the second circuit pattern layer constitute a capacitor,
    the first circuit pattern layer and the second circuit pattern layer are electrically connected so as to allow electrical continuity therebetween, and
    the base material includes a plurality of void-state-air layers, a relative density of the base material with respect to a density of the resin is less than or equal to 0.9, an average volume of the void-state-air layers is greater than or equal to 2 $\mu m^3$ and less than or equal to 90 $\mu m^3$.

2. The antenna circuit constituent body for an IC card/tag, according to claim 1, wherein the resin film is made of polyethylene terephthalate.

3. The antenna circuit constituent body for an IC card/tag, according to claim 1, wherein the resin film is a biaxially-drawn film.

4. The antenna circuit constituent body for an IC card/tag, according to claim 1, wherein the first circuit pattern layer and the second circuit pattern layer are made of aluminum foil.

5. The antenna circuit constituent body for an IC card/tag, according to claim 1, wherein each of the first circuit pattern layer and the second circuit pattern layer and the base material are thermally bonded with each adhesive layer interposed therebetween, respectively.

* * * * *